United States Patent [19]

Hosen

[11] Patent Number: 5,543,659
[45] Date of Patent: Aug. 6, 1996

[54] PACKAGE FOR POWER SEMICONDUCTOR DEVICE WITH SNUBBER CIRCUIT

[75] Inventor: Toru Hosen, Nagano, Japan

[73] Assignee: Fuli Electric Co., Ltd., Kawasaki, Japan

[21] Appl. No.: 327,479

[22] Filed: Oct. 21, 1994

[30] Foreign Application Priority Data

Oct. 28, 1993 [JP] Japan .................................. 5-269356

[51] Int. Cl.$^6$ .......................... H01L 23/48; H01L 23/52
[52] U.S. Cl. .......................... 257/692; 257/678; 257/730; 257/733; 257/691
[58] Field of Search ................................. 257/666, 692, 257/678, 685, 686, 691, 693, 730, 731, 732, 733

[56] References Cited

U.S. PATENT DOCUMENTS

| 4,634,891 | 1/1987 | Yamagami . |
| 5,107,329 | 4/1992 | Okinaga et al. . |
| 5,173,842 | 12/1992 | Depew . |

FOREIGN PATENT DOCUMENTS

| 0333374 | 9/1989 | European Pat. Off. . |
| 0576182A1 | 12/1993 | European Pat. Off. . |
| 61-242497 | 4/1988 | Japan .................................. 257/924 |
| 237649 | 10/1991 | Japan .................................. 257/731 |

Primary Examiner—Sara W. Crane
Assistant Examiner—Carl Whitehead, Jr.
Attorney, Agent, or Firm—Kanesaka & Takeuchi

[57] ABSTRACT

A power semiconductor device package of the invention is used for a power conversion equipment. The package is formed of a casing containing a power chip therein, external main circuit terminals for direct-current input and alternating-current output, and pin terminals for connection to an external control circuit. The main circuit terminals and pin terminals are arranged in two rows on the upper surface of the casing. In the invention, at least one of the connecting terminals for a snubber circuit and the support terminals is situated on the upper surface of the casing. The connecting terminals are connected inside the casing to the main circuit terminals for the direct-current input to have the same electric potential. The supporting terminals are arranged adjacent to the pin terminals so that a printed circuit board for the external control circuit can be securely fixed to the casing.

6 Claims, 3 Drawing Sheets

5,543,659

PACKAGE FOR POWER SEMICONDUCTOR DEVICE WITH SNUBBER CIRCUIT

BACKGROUND OF THE INVENTION AND RELATED ART STATEMENT

The present invention relates to a package for a power semiconductor device for an equipment, such as intelligent power devices to be applied to inverters and other power conversion equipments.

First, reference is made to a VVVF inverter as an example, wherein a package structure and an equivalent network diagram for a conventional power semiconductor device using an insulated-gate type bipolar transistor (IGBT) as a power-switching device are shown in FIGS. 4(a) and 4(b). In FIG. 4(a), numeral 1 represents a package made from resin; 2 represents external main circuit terminals in a fasten tab terminal structure including direct-current input terminals P and N and alternating-current output terminals U, V and W; and 3 represents pin terminals for connection to a printed circuit board of an external control circuit 4. Inside the package 1, as shown in FIG. 4(b), incorporated are a three-phase bridge inverter circuit formed of six pairs of an insulated-gate bipolar transistor chip IGBT and a free-wheeling diode D, a gate-driving circuit (not illustrated), a protection circuit (not illustrated) and so on. The aforementioned terminals 2 and 3, which are connected to these circuits, are arranged on the upper surface of the package 1.

When applying such a power semiconductor device to an inverter, the aforementioned direct-current input terminals P and N of the external terminals 2 are connected to a direct-current source, and the alternating-current power terminals U, V and W are connected to an electric motor or other load. The printed circuit board of the external control circuit 4 is connected to the pin terminals 3 arranged on the package 1 directly or through a connector. Further, in order to suppress the surge voltage produced by the high-speed switching operation of the IGBTs, a snubber circuit 5 is externally connected between the direct current input terminals P and N.

The following problems arise in the aforementioned structure;

(1) The printed circuit board of the external control circuit 4 is connected to a row of pins made of a fine wire, so that the weight of the printed circuit board is entirely borne by one row of the pin terminals 3. Thus, the mechanically weak pin terminals 3 may be bent or broken when an external vibrational load or other load is applied.

(2) The snubber circuit 5 is externally connected to the direct-current input terminals through lead wires, so that the wiring inductance of the leads is added between the input terminals and the snubber circuit. Thus, the snubber circuit is unable to adequately exhibit surge-voltage suppression effects.

In consideration of the above points, it is an object of the present invention to solve the aforementioned problems, and to provide a package for a power semiconductor device which is advantageous for connection to an external control circuit and a snubber circuit.

SUMMARY OF THE INVENTION

In order to achieve the above object, the present invention is directed to a power semiconductor device with pin terminals arranged in two rows for connection to the external main circuit terminals for direct current input and alternating-current output, and to an external control circuit. The terminals are formed on the upper surface of a package housing the power chip. The package has the following structure;

(1) On the upper surface of the package, support terminals for fixing the printed circuit board for the external control circuit are provided near the aforementioned rows of the pin terminals.

(2) On the upper surface of the package, terminals for connection to the snubber circuit are provided, which are connected at the inside thereof to have the same potential as the aforementioned direct-current input terminals and drawn outwardly.

(3) The support terminals described in the preceding paragraph (1) and the connection terminals for the snubber circuit described in the preceding paragraph (2) are both provided on the upper surface of the package.

(4) In the structure described in the previous paragraph (3), the external main circuit terminals and the pin terminals are arranged on both sides of the upper surface of the package, while the support terminals are fitted at both ends of the row of the pin terminals, and the terminals for connection to the snubber circuit are formed near the direct-current input terminals.

In the above structure, when a semiconductor device is connected to an external control circuit, the row of the pin terminals arranged on the package is soldered or otherwise affixed to the printed circuit board of the external control circuit, while the printed circuit board is mounted on the support terminals installed on the package adjacent to the aforementioned row of the pin terminals, and the printed circuit board is soldered and secured to the support terminals. Thus, these support terminals operate to locate the printed circuit board at a correct position as a reinforcing component, and while maintaining the installation position of the printed circuit board, the support terminals protect the fine wire pin terminals from breakage when a vibrating load is externally applied.

Further, by directly connecting with solder the terminals of the printed circuit board for the snubber circuit to the connecting terminals drawn out onto the upper surface of the package and internally connected at the same potential as the direct-current input terminals, the wiring inductance between the power device housed in the semiconductor device and the snubber circuit can be minimized. Thus, the snubber circuit can function effectively, and can suppress the surge voltages produced by the switching of the semiconductor device.

In addition, the support terminals for securing the printed circuit board for the external control circuit and the snubber circuit connecting terminals are both provided on the upper surface of the package, so that the aforementioned functions can be achieved simultaneously.

DETAILED DESCRIPTION OF PREFERRED EMBODIMENTS

Figure 4A:
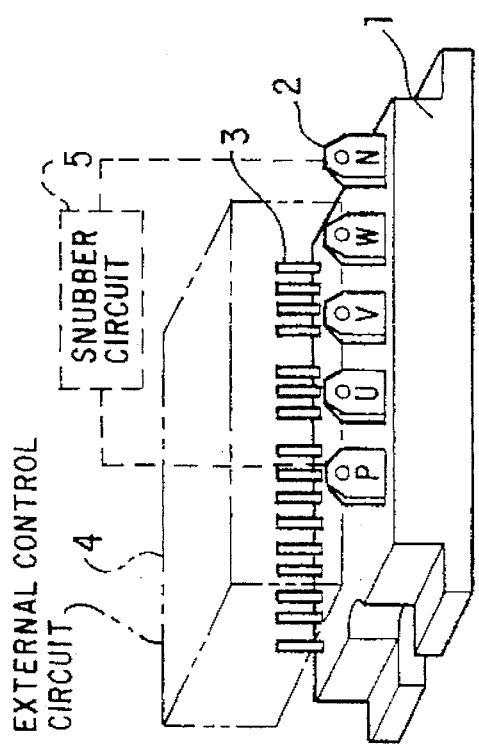
FIG. 4(a) is an external perspective view of a conventional power semiconductor device package.
Figure 4B:
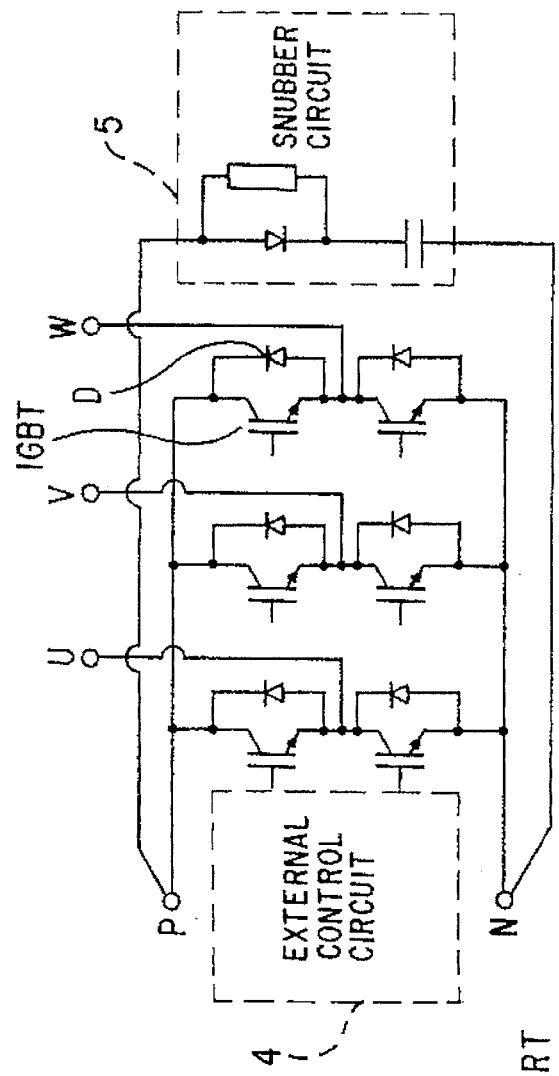
FIG. 4(b) is an equivalent circuit diagram of the power semiconductor device as shown in FIG. 4(a).

Embodiments of the present invention are described below with reference to the drawings. In the drawings, the same components as used in FIG. 4 have the same numerals.

Figure 1:
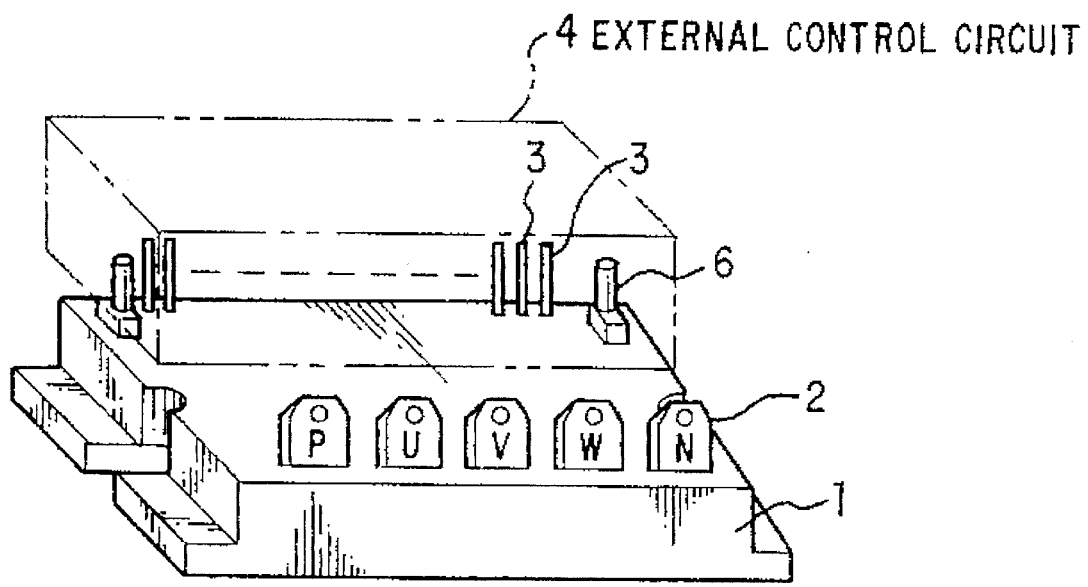
FIG. 1 is an external perspective view of a semiconductor device package corresponding to a first embodiment of the present invention.

FIG. 1 is a perspective view for showing a first embodiment of the present invention. In this embodiment, in addition to external main circuit terminals 2 and pin terminals 3 for connection to an external control circuit 4 to be located on the upper surface of package 1, two support terminals 6 for securing the printed circuit board of the control circuit 4 are provided on the left and right ends of package 1 parallel to the row of the pin terminals 3. These support terminals 6 are formed of thick wires in order not to bend under external loads.

In addition, when the printed circuit board of the external control circuit 4 is mounted above the package 1 and is connected to the semiconductor device, the aforementioned support terminals 6 act as position locators and support components. The printed circuit board is mounted on these support terminals in a fixed position, and the support terminals 6 and the printed circuit board are soldered and secured together. Mutual interconnection of the pin terminals 3 to the circuits of the printed circuit board is achieved either through the soldering or through the use of a connector.

Figure 2:
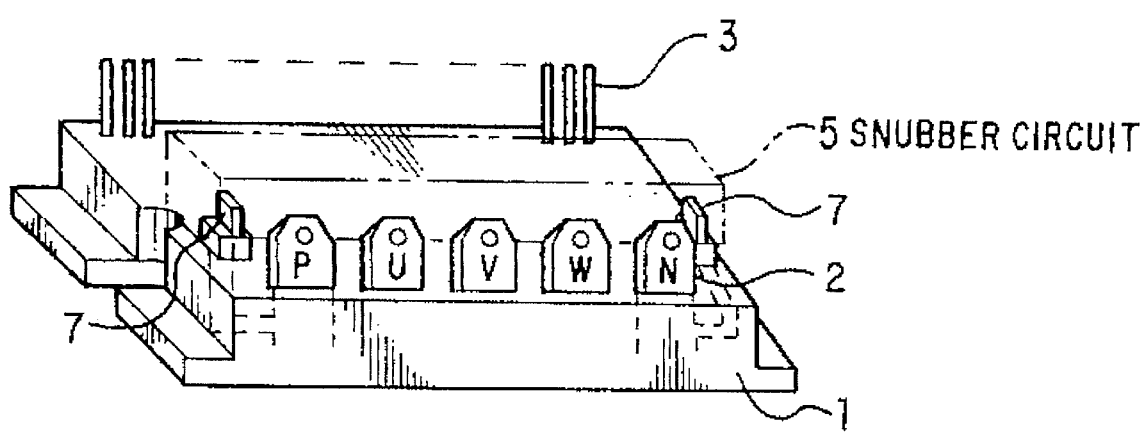
FIG. 2 is an external perspective view of a semiconductor device package corresponding to a second embodiment of the present invention.

FIG. 2 is a perspective view showing a second embodiment of the present invention. In this embodiment, in addition to the external main circuit terminals 2 and the pin terminals 3 for connection to an external control circuit located on the upper surface of the package 1, a pair of snubber-circuit connecting terminals 7 is provided adjacent to the external main circuit terminals 2 on the left and right ends of the package 1. Moreover, the connecting terminals 7 are respectively connected inside the package to the direct-current input terminals P and N to have the same electric potential as the terminals P and N.

in addition, when connecting the snubber circuit 5 to the circuits of the semiconductor device, the printed circuit board of the snubber circuit 5 is mounted on the aforementioned pair of connecting terminals 7, and the terminals of the snubber circuit 5 and the connecting terminals 7 on the package side are directly connected by soldering.

Figure 3A:
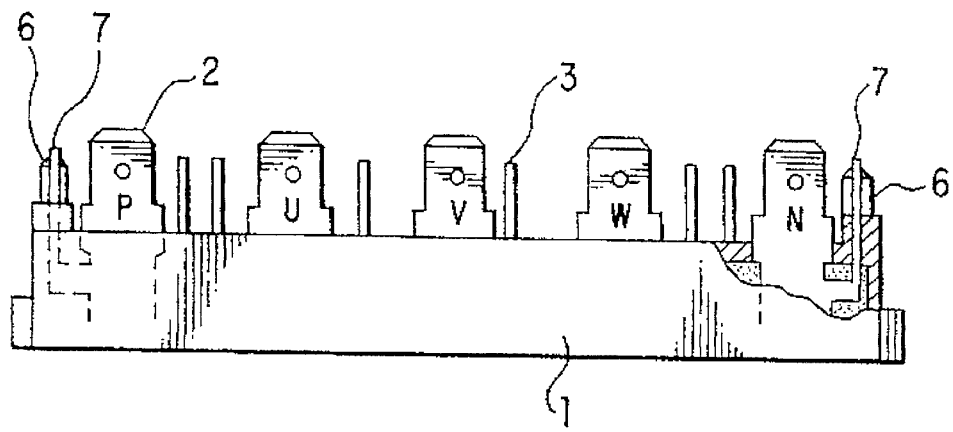
FIG. 3(a) is a front external view of a semiconductor device package corresponding to a third embodiment of the present invention.
Figure 3B:
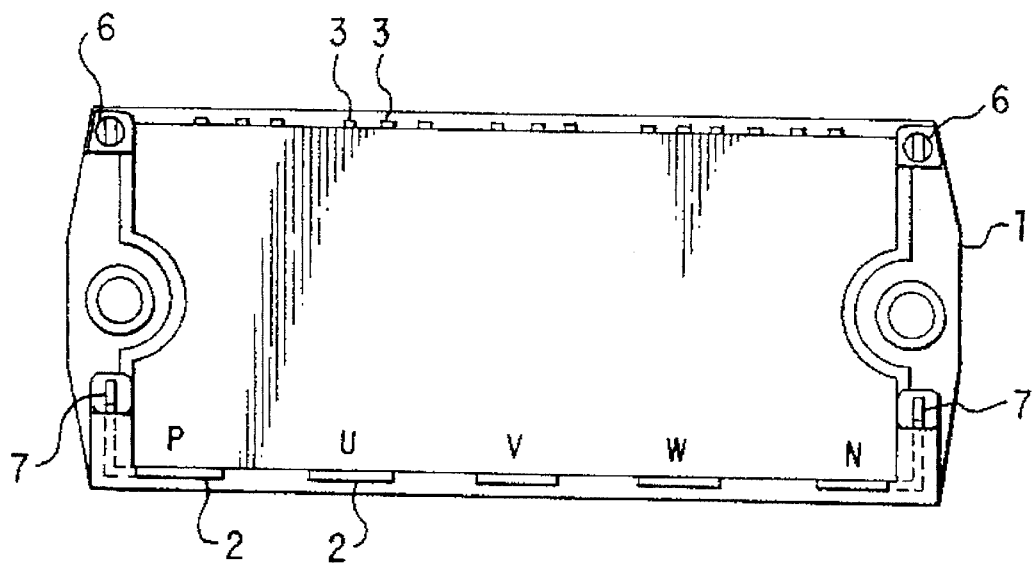
FIG. 3(b) is a plan view of the semiconductor device as shown in FIG. 3(a)
Figure 3C:
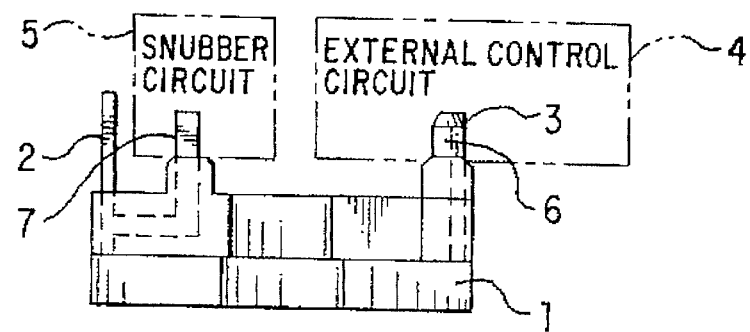
FIG. 3(c) is a side view of the semiconductor device as shown in FIG. 3(a)

FIGS. 3(a)–3(c) show a third embodiment of the present invention. In this embodiment, in addition to the external main circuit terminals 2 and the pin terminals 3 for connection to the control circuit, the support terminals 6 and the snubber-circuit connecting terminals 7 described in the first and second embodiments are provided on both the left and right sides of the package 1. In addition, when connecting the external control circuit 4 and the snubber circuit 5 to the semiconductor device, as shown in FIG. 3(c), the printed circuit board of the external control circuit 4 is secured to the supporting terminals 6 with solder, and the pin terminals 3 and the printed circuit board are connected either with solder or through the use of a connector. Further, upon mounting the printed circuit board of the snubber circuit 5 on the connecting terminals 7, the connecting terminals 7 and the terminals of the snubber circuit 5 are soldered.

As described above, in accordance with the structure of the present invention, the support terminals soldered and secured to the printed circuit board are provided adjacent to the row of the pin terminals for connection of the control circuit, so that the support strength for the printed circuit board of the control circuit mounted on the semiconductor device package is increased, and in this way, problems, such as deformation and breakage of the fine wire pin terminals resulting from the application of external vibrations or other such loads, can be prevented.

Further, for connecting the snubber circuit to the circuit of the semiconductor device, the internally connected snubber circuit connection terminals with the same electric potential as the direct current input terminals are formed on the package separately from the external main circuit terminals, so that the wiring inductance between the device housed in the semiconductor device and the snubber circuit can be minimized. Thus, the snubber circuit effectively operates to thereby effectively suppress surge voltages produced as a result of the switching of the semiconductor device, and thus providing a highly reliable semiconductor device.

What is claimed is:

1. A combination of a printed circuit board for an external control circuit and a power semiconductor device package for a power conversion equipment, said power semiconductor device package comprising, a casing containing power chips therein, external main circuit terminals for direct-current input and alternating-current output, and pin terminals for connection to the external control circuit, said main circuit terminals and said pin terminals being arranged separately in two rows on an upper surface of the casing, and support terminals situated on the upper surface of the casing adjacent to the pin terminals, said printed circuit board for the external control circuit being firmly and securely fixed to the casing through the support terminals, said support terminals forming means for preventing breakage of the pin terminals due to load applied thereto.

2. A combination of a power semiconductor device package for a power conversion equipment and a snubber circuit, said power semiconductor device package comprising, a casing containing power chips therein, external main circuit terminals for direct-current input and alternating-current output, and pin terminals for connection to an external control circuit, said main circuit terminals and said pin terminals being arranged separately in two rows on an upper surface of the casing, and connecting terminals for the snubber circuit situated on the upper surface of the casing and directly connected to the snubber circuit, said connecting terminals being connected inside the casing to the main circuit terminals for the direct-current input and having a same electric potential as in the main circuit terminals.

3. A combination including said external control circuit according to claim 2, wherein said power semiconductor device package further includes support terminals situated on the upper surface of the casing adjacent to the pin terminals, said printed circuit board for the external control circuit being firmly and securely fixed to the casing through the support terminals, said support terminals forming means for preventing breakage of the pin terminals due to load applied thereto.

4. A combination according to claim 3, wherein the external main circuit terminals and the pin terminals are arranged on both sides of the upper surface of the casing parallel to each other, said support terminals are installed on both ends of the row of the pin terminals, and the connecting terminals are installed near the direct-current input terminals.

5. A combination according to claim 4, wherein said direct-current input terminals are located on both ends of the row of the external main circuit terminals.

6. A combination according to claim 2, wherein said connecting terminals are arranged between said two rows to install said snubber circuit therebetween.

* * * * *